(12) United States Patent
Choi et al.

(10) Patent No.: US 8,817,234 B2
(45) Date of Patent: Aug. 26, 2014

(54) OPTICAL DEVICE AND EXPOSURE APPARATUS INCLUDING THE SAME

(75) Inventors: Jin Choi, Seoul (KR); Byung-gook Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 520 days.

(21) Appl. No.: 13/180,776

(22) Filed: Jul. 12, 2011

(65) Prior Publication Data

US 2012/0013880 A1    Jan. 19, 2012

(30) Foreign Application Priority Data

Jul. 13, 2010    (KR) .................. 10-2010-0067472

(51) Int. Cl.
*G03B 27/54* (2006.01)
*G03F 7/20* (2006.01)
*G02B 27/42* (2006.01)
*G02B 27/09* (2006.01)
*G02B 3/00* (2006.01)

(52) U.S. Cl.
CPC ........ *G03F 7/70208* (2013.01); *G03F 7/70275* (2013.01); *G02B 27/4277* (2013.01); *G02B 27/0905* (2013.01); *G02B 3/0062* (2013.01)
USPC .......................................... 355/67; 359/622

(58) Field of Classification Search
CPC ............ G03F 7/70158; G03F 7/70191; G03F 7/70075; G03F 7/70383; G03F 7/70275; H01J 2237/31774; H01J 2237/31735; G02B 27/0043; G02B 27/4272; G02B 27/4277; G02B 27/0905; G02B 27/44
USPC ........... 355/53, 67, 71; 349/95; 359/565, 566, 359/621, 622

See application file for complete search history.

(56) References Cited

U.S. PATENT DOCUMENTS

| | | | |
|---|---|---|---|
| 6,381,072 B1 * | 4/2002 | Burger | 359/622 |
| 6,960,773 B2 * | 11/2005 | Menon et al. | 250/492.2 |
| 6,967,711 B2 * | 11/2005 | Gui | 355/67 |
| 7,081,947 B2 * | 7/2006 | Gui et al. | 355/55 |
| 2008/0180648 A1 * | 7/2008 | Mei | 355/67 |

FOREIGN PATENT DOCUMENTS

| | | |
|---|---|---|
| JP | 2002-319532 | 10/2002 |
| JP | 2008-027965 | 2/2008 |
| KR | 10-2008-0064400 A | 7/2008 |

* cited by examiner

*Primary Examiner* — Steven H Whitesell Gordon
(74) *Attorney, Agent, or Firm* — Lee & Morse, P.C.

(57) ABSTRACT

An optical device for splitting a single beam to a plurality of beams and an exposure apparatus including the optical device are disclosed. The optical device includes a first DOE lens array including a plurality of first diffractive optical element (DOE) lenses that are two-dimensionally arranged on a first plane and a second lens array including a plurality of second DOE lenses arranged on a second plane parallel to the first plane so as to respectively correspond to the plurality of first DOE lenses. The first DOE lens array splits a first parallel beam into a plurality of second beams by condensing the first parallel beam and the second DOE lens array modifies the plurality of second beams into a plurality of third beams.

19 Claims, 9 Drawing Sheets

OPTICAL DEVICE AND EXPOSURE APPARATUS INCLUDING THE SAME

CROSS-REFERENCE TO RELATED APPLICATIONS

Korean Patent Application No. 10-2010-0067472, filed on Jul. 13, 2010, in the Korean Intellectual Property Office, and entitled: "Optical Device and Exposure Apparatus Including the Same," is incorporated by reference herein in its entirety.

BACKGROUND

1. Field

The inventive concept relates to an optical device for modifying a single beam into a bundle of beams and an exposure apparatus including the optical device. More particularly, embodiments relate to an exposure apparatus for a lithography operation that is used to manufacture a device, e.g., a semiconductor device, an image pickup device, a liquid crystal display (LCD) device, a thin film magnetic head, etc., and an optical device included in the exposure apparatus.

2. Description of the Related Art

Many beam splitting apparatuses are disclosed in the art to which the inventive concept pertains. A typical beam splitting apparatus modifies a single beam into a plurality of beams using partially-coated mirrors. However, since the beam splitting apparatus uses a plurality of optical elements, alignment of all of the optical elements may be difficult, the structure of the beam splitting apparatus may be complicated, and the number of mirrors may have to increase as the number of beams is increased.

SUMMARY

Embodiments are directed to an optical device for modifying a single beam into a plurality of beams and to an exposure apparatus including the optical device.

Some embodiments may provide an optical device includes a first lens array including a plurality of first diffractive optical element (DOE) lenses that are two-dimensionally arranged on a first plane, and that split a first parallel beam into a plurality of second beams by condensing the first parallel beam; and a second lens array including a plurality of second DOE lenses that are arranged on a second plane parallel to the first plane so as to respectively correspond to the plurality of first DOE lenses, and that modify the plurality of second beams into a plurality of third beams.

An interval between the first plane and the second plane may be equal to the sum of a focal length of each of the first DOE lenses and a focal length of each of the second DOE lenses, and the plurality of third beams may be parallel beams that are perpendicular to the second plane. The focal length of each of the first DOE lenses may be greater than the focal length of each of the second DOE lenses. In addition, a ratio of intensity per unit area of the first parallel beam to intensity per unit area of the bundle of beams may be proportional to a square of a ratio of a focal length of each of the first DOE lenses to a focal point of each of the second DOE lenses.

The optical device may further include a piezoelectric device that is disposed between the first lens array and the second lens array. A divergent angle of the third beams may be adjusted by controlling a voltage applied to the piezoelectric device to control an interval between the first lens array and the second lens array.

Each of the first DOE lenses or each of the second DOE lenses may include a Fresnel zone plate, or a kinoform lens, and may be manufactured by using a photomask manufacturing method including a photography process and an etching process.

The optical device may further include a filter including apertures formed so as to respectively correspond to centers of the first DOE lenses, wherein the filter is disposed on a third plane parallel to the first plane, wherein the third plane is spaced from the first plane by a focal length of each of the first DOE lenses.

The optical device may further include a liquid crystal panel including a plurality of liquid crystal cells that change a phase of a beam according to driving of liquid crystals therein; and a rear polarization plate for controlling intensity of the beam according to the phase of the beam, wherein the liquid crystal panel is disposed on an optical path of the second beams or an optical path of the third beams so that the second beams or the third beams are transmitted through the liquid crystal cells. In addition, the liquid crystal cells may be independently controlled so as to independently control intensities of the second beams.

Further embodiments may provide an exposure apparatus including a beam generator for generating a first parallel beam; a first lens array including a first DOE lenses for splitting a first parallel beam into a plurality of second beams by condensing the first parallel beam; a second lens array including a plurality of second DOE lenses for modifying the plurality of second beams into a plurality of third beams; and an imaging unit for forming an image on a photosensitive material using the plurality of third beams.

Still further embodiments may provide an optical device including a first DOE lens array for splitting a first parallel beam into a plurality of second beams and condensing the plurality of second beams and a second DOE lens array parallel to the first DOE lens array, DOE lenses in the first and second DOE lens arrays being in a one-to-one correspondence, the second DOE lens array condensing the plurality of second beams and outputting a plurality of third beams.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
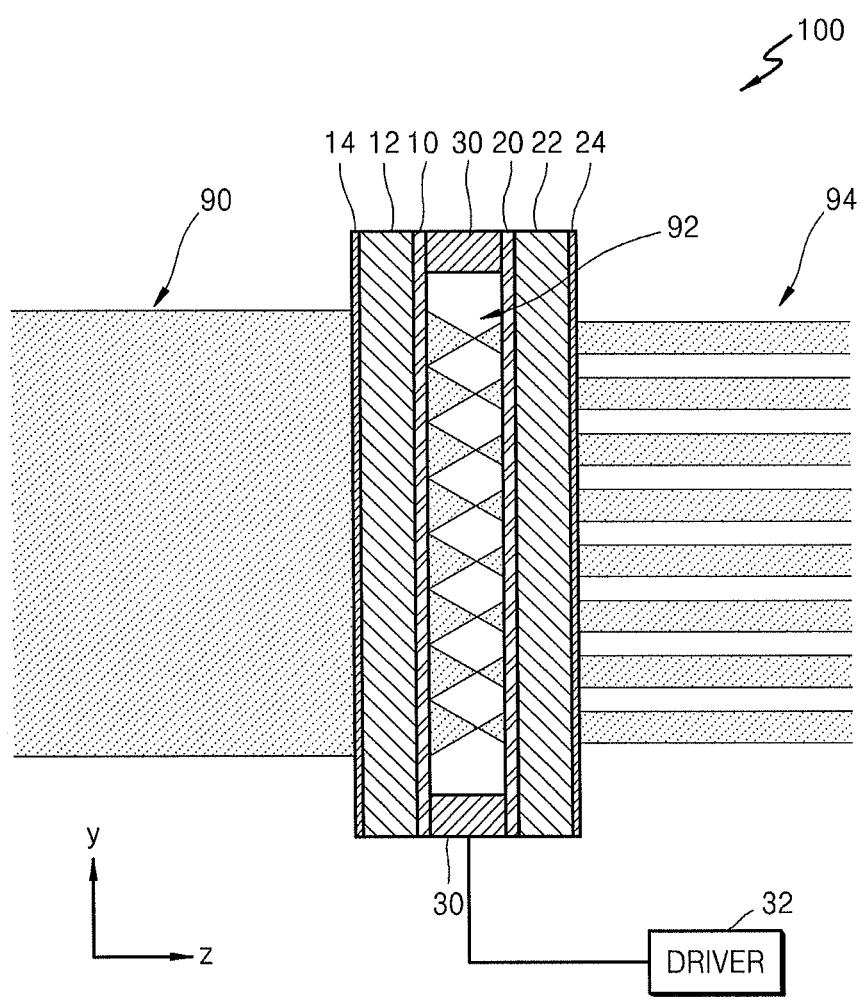
FIG. 1 illustrates a conceptual diagram of an optical device according to an embodiment of the inventive concept.

Hereinafter, the inventive concept will be described in detail by explaining exemplary embodiments of thereof with reference to the attached drawings.

Reference will now be made in detail to example embodiments, examples of which are illustrated in the accompanying drawings. However, the inventive concept is not limited to the embodiments described hereinafter, and the embodiments herein are rather introduced to provide easy and complete understanding of the scope and spirit of the inventive concept.

In the drawings, the thicknesses of layers and regions are exaggerated for clarity, and like reference numerals refer to like elements throughout. It will be understood that when an element, such as a layer, a region, or a substrate, is referred to as being "on," "connected to" or "coupled to" another element, it may be directly on, connected or coupled to the other element or intervening elements may be present.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third etc. may be used herein to describe various elements, members, components, regions, layers and/or sections, these elements, members, components, regions, layers and/or sections should not be limited by these terms. These terms are only used to distinguish one element, member, component, region, layer or section from another region, layer or section. Thus, a first element, member, component, region, layer or section discussed below could be termed a second element, member, component, region, layer or section without departing from the teachings of the inventive concept.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

FIG. 1 illustrates a conceptual diagram of an optical device 100 according to an embodiment of the inventive concept. Referring to FIG. 1, the optical device 100 may include a first lens array 10 and a second lens array 20 arranged in parallel to the first lens array 10.

The first lens array 10 may be formed on a first surface of a first transparent plate 12, i.e., in a first plane. The first lens array 10 may include a plurality of first diffractive optical element (DOE) lenses 16 (see FIG. 2) arranged in a two-dimensional matrix. The first DOE lenses 16 may each be a condensing lens. The DOE lenses 16 split a first parallel beam 90, i.e., collimated beam, that is orthogonally incident on the first DOE lenses 16 through the first transparent plate 12 into a plurality of second beams 92. When a parallel beam is orthogonally incident on a condensing lens, i.e., appears to be at infinity, the parallel beam is focused to a focal point of the condensing lens.

Thus, the first parallel beam 90 that proceeds from left to right, i.e., along the z-axis, in FIG. 1 is split by the first DOE lenses 16 while being transmitted through the first lens array 10 and is focused at a focal plane that includes the focal points of the first DOE lenses 16. For convenience of understanding, beams output from the first DOE lenses 16 towards the focal plane of the first DOE lenses 16 will be referred to as the second beams 92. After the second beams 92 propagate through the focal plane of the first DOE lenses 16, the second beams 92 may diverge.

The first transparent plate 12 may be formed of a transparent material through which the first parallel beam 90 may be transmitted. For example, the first transparent plate 12 may be a quartz substrate, a glass substrate, a transparent plastic substrate, and so forth.

An anti-reflective layer 14 may be formed on a second surface of the first transparent plate 12 that is opposite to the first surface of the first transparent plate 12. In other words, the first parallel beam 90 will be incident on the anti-reflective layer 14 before the first lens array 10. The anti-reflective layer 14 may reduce an amount of a portion of the first parallel beam 90 reflected off the first DOE lenses 16, and may increase an amount of a portion of the first parallel beam 90 transmitted through the first DOE lenses 16. That is, the anti-reflective layer 14 may prevent a case where the first parallel beam 90 may be reflected to prevent loss in the optical intensity of the first parallel beam 90. The anti-reflective layer 14 may be mainly formed of a transition metal, e.g., chromium (Cr), tantalum (Ta), ruthenium (Ru), or platinum (Pt), and may further include at least one of nitrogen (N), oxygen (O), carbon (C), and fluorine (F).

The second lens array 20 may be formed on a first surface of a second transparent plate 22, i.e., at a second plane. The second lens array 20 may include a plurality of second DOE lenses 26 (see FIG. 3) arranged to correspond to the first DOE lenses 16. The second lens array 20 is arranged in parallel to the first lens array 10, and the second DOE lenses 26 and the first DOE lenses 16 may be arranged in a one to one correspondence. The second DOE lenses 26 may each be a condensing lens that modifies the second beams 92, which diverge after passing through the focal points of the first DOE lenses 16, into third beams 94. The third beams 94 refer to beams that are emitted from the second lens array 20.

When a light source is located at a focal point of a condensing lens, a beam emitted from the light source is transmitted through the condensing lens proceeds in a direction perpendicular to a plane of the condensing lens, i.e., parallel to the optical or z-axis. Thus, if the focal planes of the first DOE lenses 16 and the second DOE lenses 26 coincide, the second beams 92 are converged into parallel beams by the second DOE lenses 26 and propagate in a direction perpendicular thereto. The parallel beams are referred to as the third beams 94 of FIG. 1.

When the first lens array 10 and the second lens array 20 are spaced apart from each other by an interval corresponding to, e.g., equaling, the sum of a focal length of each first DOE lens 16 and a focal length of each second DOE lens 26, the third beams 94 emitted from the second lens array 20 may be parallel beams. However, if the interval between the first lens array 10 and the second lens array 20 is smaller or greater than the sum of the focal length of the first DOE lenses 16 and the focal length of the second DOE lenses 26, the third beams 94 may be converged towards or may diverge from the z-axis.

Similar to the first transparent plate 12, the second transparent plate 22 may be formed of a transparent material through which the third beams 94 may be transmitted, e.g., a quartz substrate, a glass substrate, a transparent plastic substrate, etc. In addition, an anti-reflective layer 24 may also be formed on a second surface of the second transparent plate 22 opposite to the first surface of the second transparent plate 22. The anti-reflective layer 24 may be disposed on the second surface of the second transparent plate 22, from which the third beams 94 are emitted, and may prevent light from being reflected off an interface between air and the second transparent plate 22. The anti-reflective layer 24 may be formed of materially the same material as the anti-reflective layer 14.

The optical device 100 may further include a piezoelectric element 30 between, e.g., in direct contact with, the first lens array 10 and the second lens array 20. When a voltage is applied to the piezoelectric element 30 from a driver 32 in a predetermined direction, the crystals of the piezoelectric element 30 may be modified and, thus, the size, e.g., length along the z-axis, of the piezoelectric element 30 may be changed. According to the voltage applied to the piezoelectric element 30, the interval, e.g., along the z-axis, between the first lens array 10 and the second lens array 20 may be controlled. By controlling the interval, i.e., the distance between the first and second planes, an angle at which the third beams 94 converge or diverge is modified. For example, according to surrounding conditions such as temperature and humidity, the interval between the first lens array 10 and the second lens array 20 may be changed. However, the interval may be easily controlled by disposing the piezoelectric element 30 between the first lens array 10 and the second lens array 20. In addition, the interval may be controlled to converge or diverge the third beams 94, if necessary.

The first parallel beam 90, the second beams 92, and the third beams 94 are beams each having a relatively great intensity and each having a relatively low spread. For example, the first parallel beam 90, the second beams 92, and the third beams 94 may be laser beams. In FIG. 1, the first parallel beam 90, the second beams 92, and the third beams 94 proceed from left to right. The first parallel beam 90 may have a single wavelength and/or may be polarized.

Figure 2:
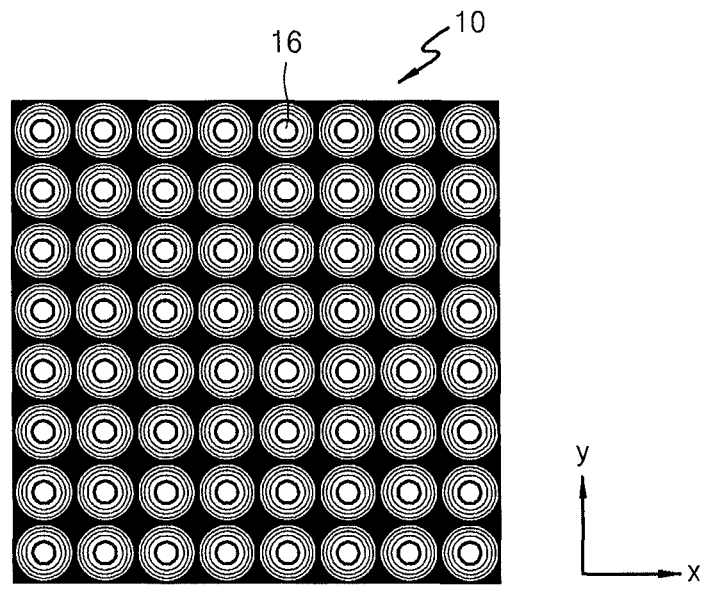
FIGS. 2 and 3 illustrate respectively diagrams of a first lens array and a second lens array of FIG. 1.
Figure 3:
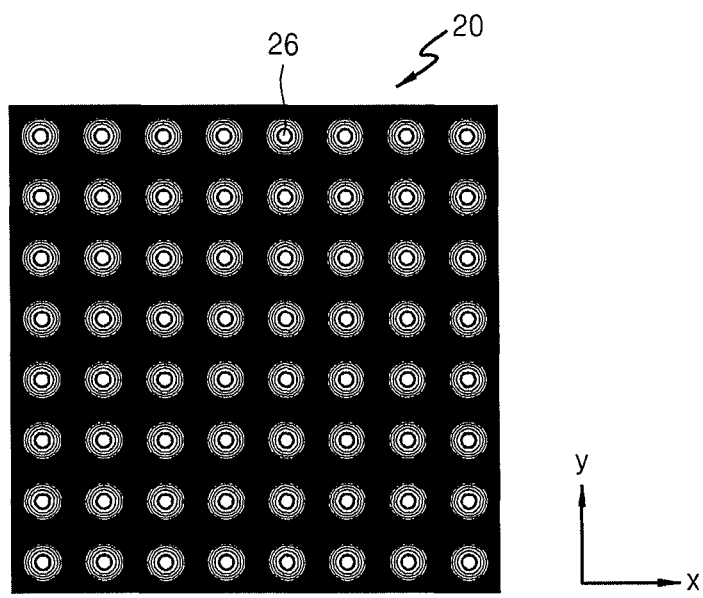

FIGS. 2 and 3 respectively illustrate the first lens array 10 and the second lens array 20 of FIG. 1. In FIGS. 2 and 3, the first DOE lenses 16 and the second DOE lenses 26 are Fresnel zone plate lenses, but this is just an example, and the inventive concept is not limited thereto.

Referring to FIGS. 2 and 3, the first lens array 10 includes the first DOE lenses 16 arranged in an 8×8 array and the second lens array 20 includes the second DOE lenses 26 arranged in an 8×8 array corresponding to the first lens array 10. Pitches between the second DOE lenses 26 are the same as pitches between the first DOE lenses 16. In addition, the arrangement of the second DOE lenses 26 is the same as that of the first DOE lenses 16. Thus, centers of the second DOE lenses 26 are the same as those of the first DOE lenses 16.

However, as shown in FIGS. 2 and 3, the size of each first DOE lens 16 may be greater than the size of each second DOE lens 26. In addition, inner rings of the second DOE lenses 26 may be formed together more densely than inner rings of the first DOE lenses 16. Thus, the focal length of the second DOE lenses 26 may be smaller than that of the first DOE lenses 16. In this case, a ratio of intensity per unit area of parallel beams that are transmitted through the second DOE lenses 26 to intensity per unit area of parallel beams that are incident on the first DOE lenses 16 may be proportional to the square of a ratio of the focal length of the first DOE lenses 16 to the focal length of the second DOE lenses 26. Thus, if it is required that a plurality of beams generated by the optical device 100 have a predetermined intensity, the focal lengths of the first DOE lenses 16 and the second DOE lenses 26 may be designed to provide the predetermined intensity.

When a single parallel beam is transmitted through the first lens array 10 of FIG. 2 and the second lens array 20 of FIG. 3, 64 beams are generated. In addition, 64 parallel beams may be formed by controlling the interval between the first lens array 10 and the second lens array 20. This process may be achieved by the above-described simple structure, which has optical elements that may be easily arranged.

Figure 4A:
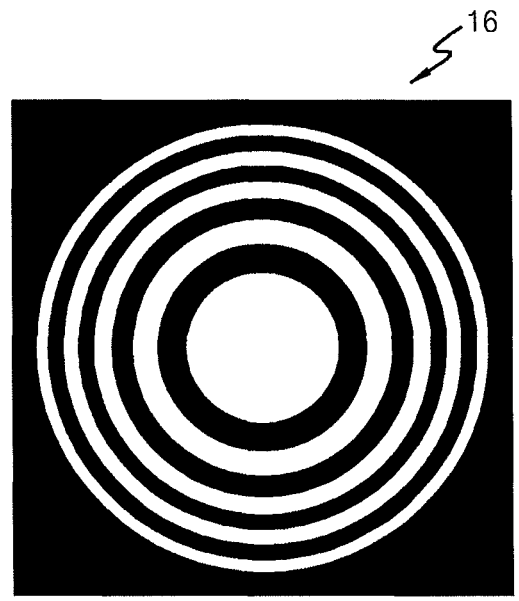
FIGS. 4A and 4B illustrate diagrams of a first diffractive optical element (DOE) lens of FIG. 2.
Figure 4B:
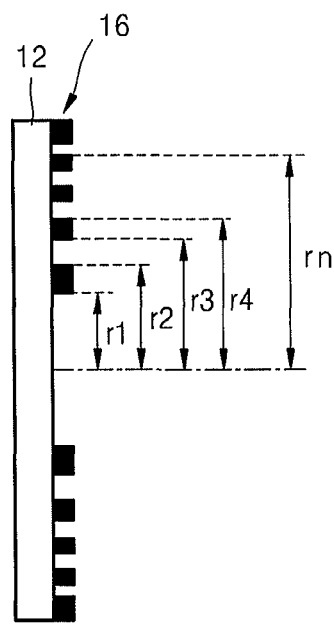

FIGS. 4A and 4B illustrate one of the first DOE lenses 16 of FIG. 2. FIG. 4A illustrates a plan view of the first DOE lens 16. FIG. 4B illustrates a side sectional view of the first DOE lens 16. In FIGS. 4A and 4B, the first DOE lens 16 is a Fresnel zone plate lens.

The Fresnel zone plate lens focuses light via diffraction rather than refraction. As shown in FIG. 4A, the first DOE lens 16 includes concentric, radially symmetric rings. In FIGS. 4A and 4B, a central circular region of the first DOE lens 16 is transparent. However, the central circular region may instead be opaque, and locations of opaque rings and the transparent rings may be reversed.

Each ring of the first DOE lens 16 of FIG. 4A may be designed to have radii defined as follows:

$$r_n = \sqrt{n\lambda f + \frac{n^2\lambda^2}{4}}$$

In this equation, $r_n$ is a radius of a ring. As shown in FIG. 4B, $r_1$ refers to an inner radius of a first ring, and $r_2$ refers to an outer radius of the first ring. Thus, when 'n' is an even number, $r_n$ refers to an outer radius of an $n/2^{th}$ ring. When 'n' is an odd number, $r_n$ refers to an inner radius of an $(n+1)/2^{th}$ ring. In addition, 'λ' refers to a wavelength of a beam that is incident on the first DOE lens 16, and 'f' refers to the focal length of the first DOE lens 16.

The rings of the first DOE lens 16 are to have radii that correspond to a wavelength of a beam used in the optical device 100 and the focal length of the first DOE lens 16. That is, when the wavelength of the beam used in the optical device 100 and a desired focal length of the first DOE lens 16 are appropriately determined, the first DOE lens 16 may be easily designed.

Referring to FIG. 4B, the opaque rings may be formed of an opaque material formed on the first transparent plate 12. To this end, the opaque material may be formed on the first transparent plate 12. The opaque material may be a metal, e.g., chromium (Cr), a resin, and so forth. A photomask may be formed thereon. Then, the opaque material may be patterned by using a photolithography process and an etching process. Thus, the opaque rings having the radii described above may be obtained. As a result, as shown in FIG. 4B, the first DOE lens 16 may be formed.

The first DOE lens 16 may be precisely manufactured by using the above-described semiconductor manufacturing method. In addition, when the semiconductor manufacturing method is used, since the opaque rings may have a line width of several tens of nanometers, the diameter of the first DOE lens 16 may be reduced, and the first DOE lens 16 may be designed to have a desired focal length. In addition, since the first DOE lens 16 is not a general optical lens, the first DOE lens 16 may be manufactured to have a plate shape. Thus, the size of the optical device 100 may be reduced. Since the first DOE lens 16 is a Fresnel zone plate lens, the first DOE lens 16 may be aspherical, while still be simple to manufacture. Thus, the first DOE lens 16 may be free from various problems common to refractive lenses, such as chromatic aberration, spherical aberration, astigmatism, comma, distortion, image curvature, and so forth.

In FIGS. 4A and 4B, the first DOE lens 16 is a Fresnel zone plate lens. However, it is noted that the second DOE lenses 26 may also be Fresnel zone plate lenses appropriately designed in a similar fashion.

Figure 5A:
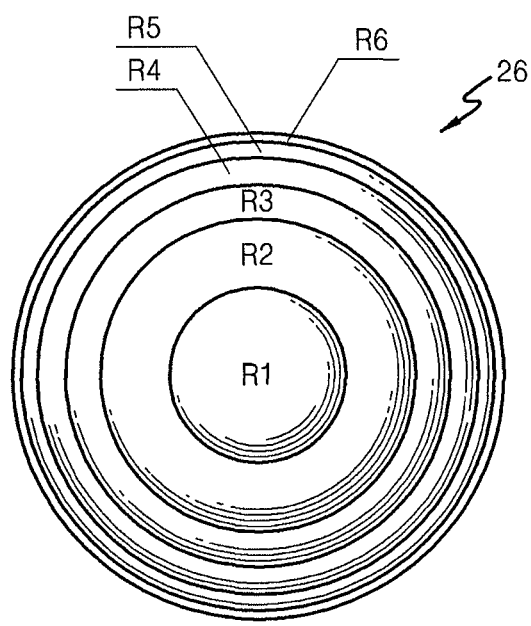
FIGS. 5A and 5B illustrate diagrams of a second DOE lens of FIG. 3.
Figure 5B:
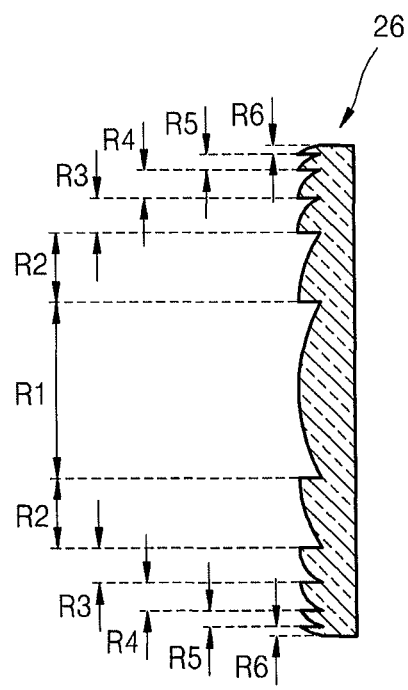

FIGS. 5A and 5B are diagrams of one of the second DOE lenses 26 of FIG. 3. FIG. 5A is a plan view of the second DOE lens 26, and FIG. 5B is a side sectional view of the second DOE lens 26 taken along a central line of the second DOE lens 26. In FIGS. 5A and 5B, the second DOE lens 26 is a kinoform lens.

Referring to FIGS. 5A and 5B, the second DOE lens 26 has a surface including first through sixth regions R1 through R6 that are formed to have step differences. In addition, the width of each region is reduced away from the first region R1 towards R6, and thus the surface gradient is increased. The second DOE lens 26 may also function as a condensing lens. Light that is transmitted through the focal point of the second DOE lens 26 and incident on the second DOE lens 26 proceeds in a direction parallel to the z-axis, i.e., in a direction perpendicular to the second plane at which the second DOE lens 26 is located. In addition, light that is incident on the second DOE lens 26 in a direction perpendicular to the second plane at which the second DOE lens 26 is located proceeds to the focal point of the second DOE lens 26.

The second DOE lens 26 of FIGS. 5A and 5B may be manufactured by using a semiconductor manufacturing method. For example, a transparent material is stacked on the second transparent plate 22, and then a photolithography process and an etching process are repeatedly performed to form a stepped surface. Then, the stepped surface is isotropically etched to form the continuous surface on the discrete regions R1-R6 as shown in FIG. 5B, and thus the kinoform lens of FIGS. 5A and 5B may be manufactured. By manufacturing the kinoform lens by using the above-described semiconductor manufacturing method, a precise DOE lens may be manufactured, and the manufactured DOE lens may have a smaller thickness than a general optical lens, for example, a convex lens. In addition, since the second DOE lens 26 uses diffraction, instead of refraction, the second DOE lens 26 may be readily made that is free from problems common to refractive lenses, e.g., aspherical aberration and chromatic aberration.

In FIGS. 5A and 5B, the second DOE lens 26 is a kinoform lens. However, it is noted that the first DOE lenses 16 may also be kinoform lenses appropriately designed in a similar fashion.

Figure 6:
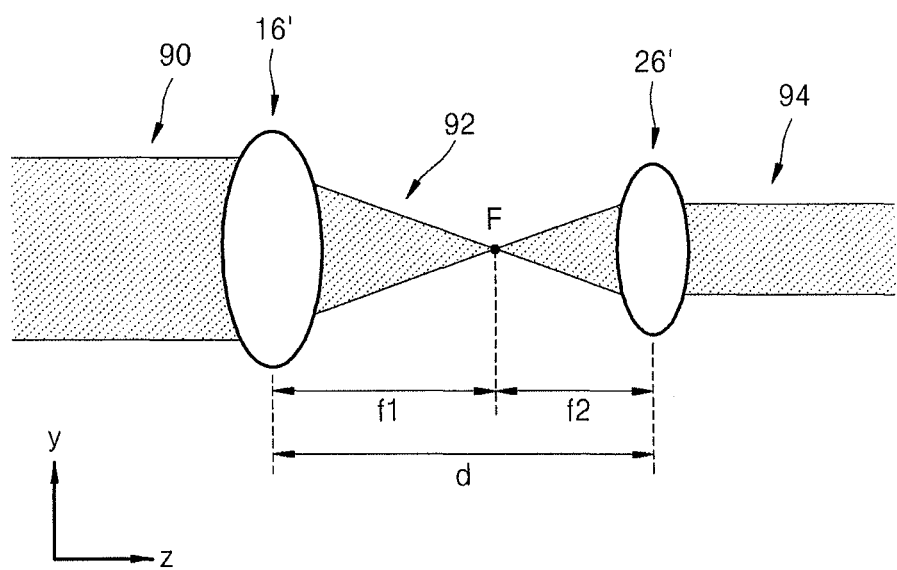
FIG. 6 illustrates a conceptual diagram for explaining the optical relationship between the first DOE lens and the second DOE lens of FIGS. 2 and 3.

FIG. 6 illustrates a conceptual diagram for explaining the optical relationship between the first DOE lens 16 and the second DOE lens 26 of FIGS. 2 and 3. In FIG. 6, the first DOE lens 16, here a first schematic lens 16', and the second DOE lens 26, here a second schematic lens 26', are illustrated schematically as a general optical lens, for convenience of illustration and ease of understanding. As described above, the first DOE lens 16 and the second DOE lens 26 do not have refractive surfaces.

Referring to FIG. 6, the first schematic lens 16' is spaced apart from the second schematic lens 26' by an interval 'd'. The focal length of the first schematic lens 16' is 'f1' and the focal length of the second schematic lens 26' is 'f2'. When 'd' is equal to the sum of 'f1' and 'f2', a portion of the first parallel beam 90 incident on the first schematic lens 16' is modified into one second beam 92 that is transmitted through a common focal point 'F' of the first schematic lens 16' and the second schematic lens 26', as shown in FIG. 6, and the second beam 92 may be modified into one third beam 94 that is perpendicular to the second schematic lens 26' after being transmitted through the second schematic lens 26'.

However, if 'd' is smaller than the sum of 'f1' and 'f2', the focal point of the second schematic lens 26' may be located on the left of the focal point of the first schematic lens 16', and the second beam 92 transmitted through the focal point of the first schematic 16' may be incident on the second schematic lens 26' at a greater incident angle than light that is transmitted through the focal point of the second DOE lens 26'. Thus, the third beam 94 may diverge from the z-axis. In addition, as the interval 'd' is further reduced, the third beams 94 may diverge at an increased angle with respect to the z-axis.

On the other hand, if 'd' is greater than the sum of 'f1' and 'f2', the focal point of the second schematic lens 26' may be located on the right of the focal point of the first schematic lens 16', and the second beams 92 transmitted through the focal point of the first schematic lens 16' may be incident on the second schematic lens 26' at a smaller incident angle than light that is transmitted through the focal point of the second schematic lens 26'. Thus, the third beam 94 may converge towards the z-axis of the second DOE lens 26'. In addition, as the interval 'd' is further increased, the third beams 94 may diverge at an increased angle with respect to the z-axis.

As described with reference to FIG. 1, since the interval 'd' may be controlled by using the piezoelectric element 30 of FIG. 1, an angle of the third beams 94 emitted from the optical device 100 may be easily controlled. Throughout this specification, when the third beams 94 are not parallel to each other, that is, when the third beams 94 converge towards the axes of the second DOE lenses 26 or diverge from the axes, the divergent angle refers to an angle measured with respect to the z-axis. Thus, when the divergent angle is positive, the third beams 94 are divergent. When the divergent angle is negative, the third beams 94 are convergent.

A right-pointing conic shape defined by the first schematic lens 16' with respect to the focal point 'F' is similar to a left-pointing conic shape defined by the second schematic lens 26' with respect to the focal point 'F'. In addition, a size ratio between the conic shapes is related to a ratio between the focal point 'f1' of the first schematic lens 16' and the focal point 'f2' of the second schematic lens 26'. Thus, when a diameter of the portion of the first parallel beam 90 incident on the first schematic 16' is 'd1', a diameter of the third beam 94 emitted from the second DOE 26 is d1*(f2/f1). In addition, the portion of the first parallel beam 90 incident on the first schematic lens 16' is transmitted through the first and second schematic lenses 16' and 26' to form the third beam 94. Thus, a ratio of intensity per unit area of the third beam 94 to intensity per unit area of the portion of the first parallel beam 90 incident on the first schematic lens 16' is $(f1/f2)^2$.

Figure 7:
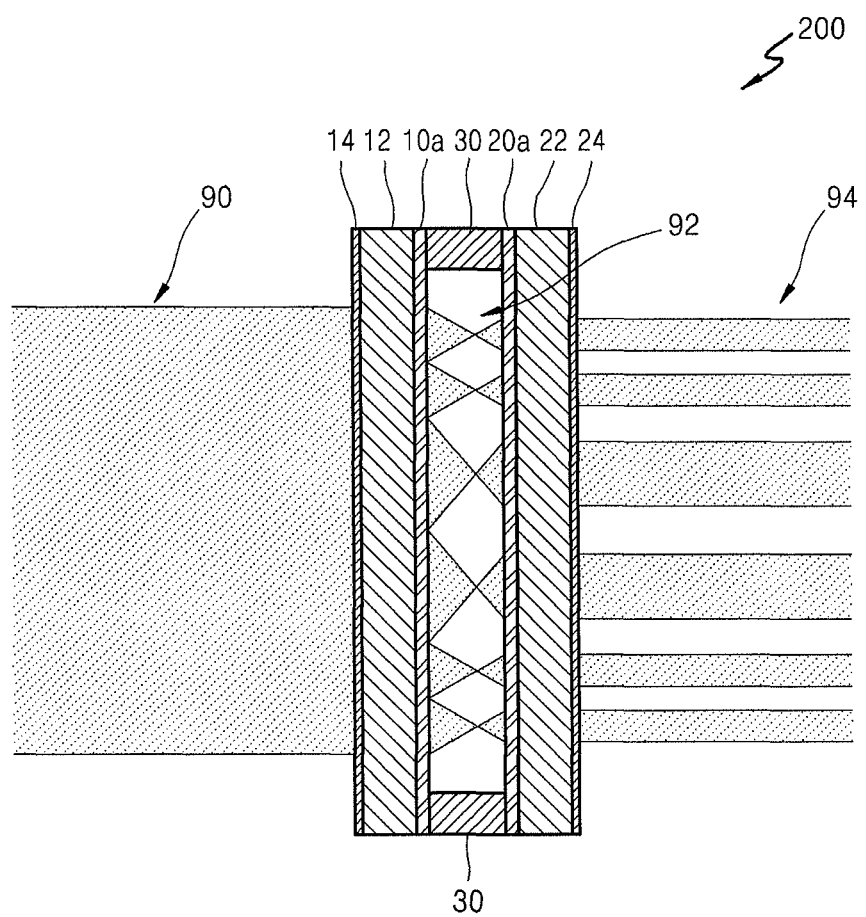
FIG. 7 illustrates a conceptual diagram of an optical device according to another embodiment of the inventive concept.

FIG. 7 illustrates a conceptual diagram of an optical device 200 according to another embodiment of the inventive concept. The optical device 200 of FIG. 7 is materially the same as the optical device 100 of FIG. 1, except for a first lens array 10a and a second lens array 20a. Detailed descriptions of the same elements will be omitted.

Referring to FIG. 7, when the first lens array 10a and the second lens array 20a are compared with the first lens array 10 and the second lens array 20 of FIG. 1, each of the first lens array 10a and the second lens array 20a may include DOE lenses having sizes different from the remaining DOE lenses, i.e., non-uniform sizes within each lens array. In this particular example, the DOE lenses having different sizes are located on a central portion of each of the first lens array 10a and the second lens array 20*a*. However, even though the DOE lenses may have different sizes, they all still may have the same focal length.

As shown in FIG. 7, some DOE lenses may have sizes different from the remaining DOE lenses, and thus the third beams 94 emitted through the second lens array 20*a* may have different diameters. That is, when the DOE lenses of the first lens array 10*a* have the same focal length, and the DOE lenses of the second lens array 20*a* have the same focal length, diameters of the third beams 94 are defined by the sizes of the DOE lenses from which the third beams 94 are transmitted, respectively. In addition, as described above, the sizes of the DOE lenses are not related to a wavelength of a beam to be transmitted through the DOE lenses and the focal length of each DOE lens, and thus the sizes of the DOE lenses may be easily changed. Thus, the optical device 200 may be manufactured according to various requirements of various industrial fields.

Although the diameters of the third beams 94 may vary, as long as the focal lengths are maintained, intensity per unit area may not be changed. As described above, intensity per unit area of the third beams 94 is determined solely by the ratio between the focal lengths.

As another alternative or design consideration, intensity per unit area of each third beam 94 may vary while keeping the sum of the focal length of the DOE lenses of the first lens array 10 and the focal length of the DOE lenses of the second lens array 20 constant. When the focal length of each of some DOE lenses of the first lens array 10*a* is 'd1', and the focal length of each of some corresponding DOE lenses of the second lens array 20*a* is 'd2', intensity per unit area of the third beams 94 of the some DOE lenses may be a value obtained by multiplying intensity per unit area of the first beam 90 by $(d1/d2)^2$. When the focal length of remaining DOE lenses of the first lens array 10*a* is (d1+a) and the focal length of each of the corresponding remaining DOE lenses of the second lens array 20*a* is (d2−a), the sum of the focal lengths is the same value, i.e., d1+d2. However, intensity per unit area of the third beams 94 transmitted through the remaining DOE lenses may be a value obtained by multiplying intensity per unit area of the first beam 90 by $((d1+a)/(d2-a))^2$. In this manner, intensity per unit area of each third beam 94 may be easily controlled.

Figure 8:
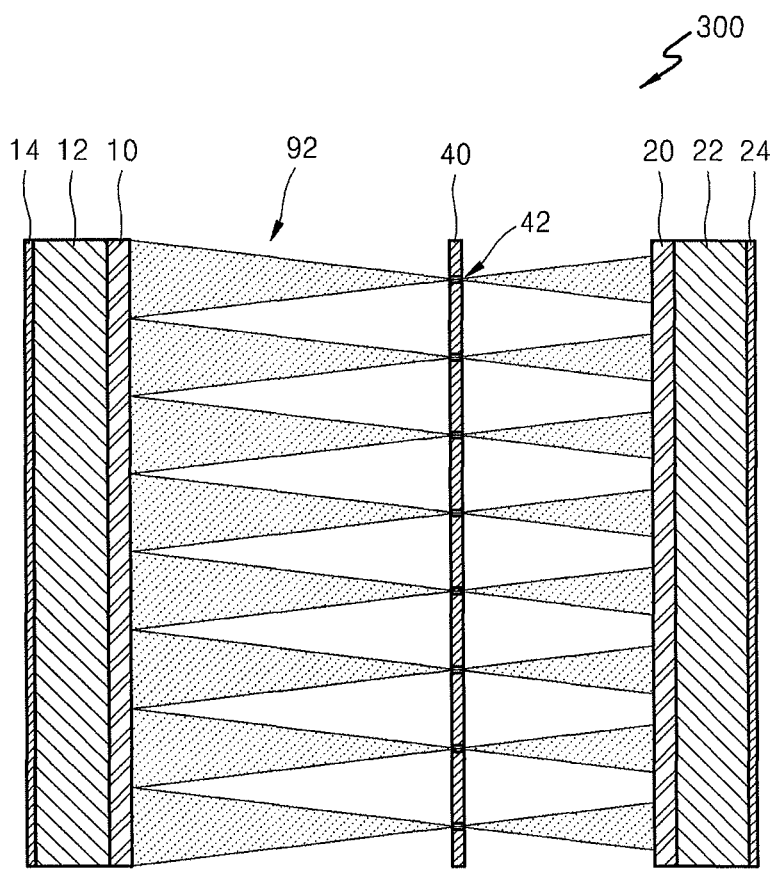
FIG. 8 illustrates a conceptual diagram of an optical device according to another embodiment of the inventive concept.

FIG. 8 is a conceptual diagram of an optical device 300 according to another embodiment of the inventive concept. The optical device 300 of FIG. 8 is materially the same as the optical device 100 of FIG. 1, except that the optical device 300 further includes a filter 40. Detailed descriptions of the same elements will be omitted.

Referring to FIG. 8, the optical device 300 further includes the filter 40. The filter 40 includes apertures 42 that respectively correspond to the centers of the DOE lenses 16, 26 of the first lens array 10 and the second lens array 20. The filter 40 is positioned in the focal plane of the first lens array 10, i.e., a third plane. Thus, the focal points of the DOE lenses 16 of the first lens array 10 may be respectively correspond in the apertures 42 of the filter 40. Theoretically, the second beams 92 emitted from the first lens array 10 are transmitted through the focal points of the DOE lenses of the first lens array 10. However, the second beams 92 may not be partially transmitted through the focal points due to errors. The filter 40 is disposed so that the second beams 92 are to be transmitted through the apertures 42, and thus the filter 40 may block portions of the second beams 92 that are not transmitted through the focal points. Accordingly, the quality of the third beams 94 (see FIG. 1) transmitted through the second lens array 20 may be improved.

In particular, if the DOE lenses 16, 26 of the first lens array 10 and the second lens array 20 are Fresnel zone plate lenses, when the Fresnel zone plate lenses are binarily divided into a transparent region and an opaque region, as shown in FIGS. 4A and 4B, focal points of higher harmonic waves are formed prior to desired focal points 'f', for example, f/3, f/5, f/7, or the like. In this case, the higher harmonic waves may also be blocked by the filter 40, thereby obtaining beams having high quality.

Figure 9:
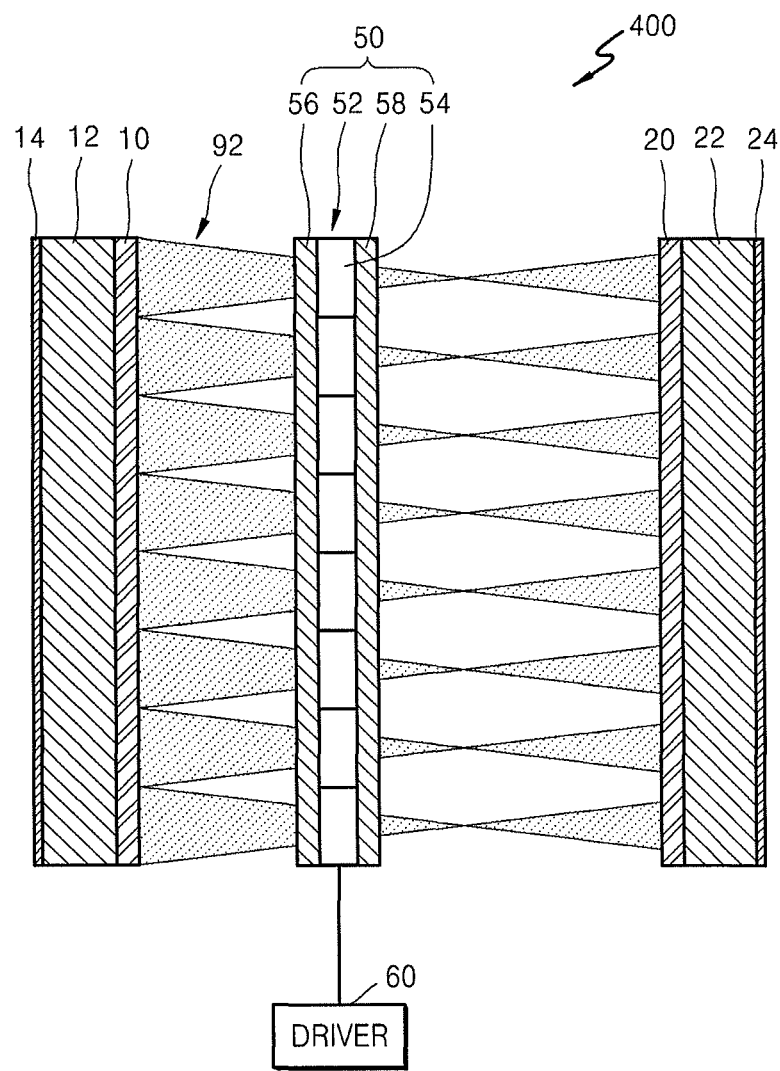
FIG. 9 illustrates a conceptual diagram of an optical device according to another embodiment of the inventive concept.

FIG. 9 is a conceptual diagram of an optical device 400 according to another embodiment of the inventive concept. The optical device 400 of FIG. 9 is materially the same as the optical device 100 of FIG. 1, except that the optical device 400 further includes a light amount controller 50. Detailed descriptions of the same elements will be omitted. For convenience of description, it is noted that repeated portions are omitted.

Referring to FIG. 9, the optical device 400 further includes the light amount controller 50. The light amount controller 50 may be disposed so as to be perpendicular to an optical path of the second beams 92. However, the inventive concept is not limited to this arrangement, and the light amount controller 50 may be disposed behind a second lens array 20. That is, the light amount controller 50 may be disposed so as to be perpendicular to optical paths of the third beams 94 of FIG. 1.

The light amount controller 50 includes a liquid crystal panel 52. The liquid crystal panel 52 includes a plurality of liquid crystal cells 54 that are disposed so as to correspond to the DOE lenses of the first lens array 10 and the second lens array 20. The liquid crystal cells 54 are disposed on the optical paths of the second beams 92, respectively, so that the second beams 92 may be transmitted through the liquid crystal cells 54.

The liquid crystal cells 54 may vary phases of the second beams 92 incident on the liquid crystal cells 54 according to driving of liquid crystals in the liquid crystal cells 54. The phase of a beam may be rotated by 0 degree when a driver 60 applies no voltage to the liquid crystals, and may be rotated by 90 degrees when the driver 60 applies a voltage to the liquid crystals. Alternatively, the phase may be rotated by 90 degrees when the driver 60 applies no voltage to the liquid crystals, and a change in the phase may be reduced as a voltage applied. However, the inventive concept is not limited to these liquid crystals. For convenience of description, it is assumed that a phase of a beam is not changed when the driver 60 applies no voltage to the liquid crystals of the liquid crystal cells 54, and a change in the phase is increased as a voltage is further applied to the liquid crystals.

The light amount controller 50 may further include a rear polarization plate 58 that is disposed behind the liquid crystal panel 52. The rear polarization plate 58 may control intensity of beams according to phases of beams transmitted through the liquid crystal cells 54.

The light amount controller 50 may further include a front polarization plate 56 that is disposed in front of the liquid crystal panel 52. The front polarization plate 56 may polarize beams incident thereon in a first direction. However, the second beams 92 transmitted through the first lens array 10 may be polarized to have phases in a predetermined direction. In this case, the front polarization plate 56 may polarize beams in the same direction as the predetermined direction. In addition, in this case, the front polarization plate 56 may be omitted.

The second beams 92 may be polarized in a first direction after being transmitted through the front polarization plate 56. Phases of the second beams 92 that are polarized in the first direction may be independently changed while the second beams 92 are respectively transmitted through the liquid crystal cells 54. The rear polarization plate 58 may polarize beams in a second direction that is perpendicular to the first direction. Only second direction components of the second beams 92 of which phases are changed in the liquid crystal cells 54 may be transmitted. That is, when the phases of the second beams 92 are changed by θ in the liquid crystal cells 54, a light amount of the second beams 92 may be reduced to a value obtained by multiplying the light amount by sin(θ) after the second beams 92 are transmitted through the rear polarization plate 58.

Anodes and cathodes may be respectively disposed between the liquid crystal panel 52 and the front polarization plate 56, and between the liquid crystal panel 52 and the rear polarization plate 58. The anodes may be disposed so that voltages may be independently applied to respective liquid cells 54, and the cathodes may be commonly used to apply a voltage to the liquid crystal cells 54. Controlling signals for controlling the liquid crystal cells 54 may be applied from the driver 60 through the anodes. The liquid crystal cells 54 may be independently and simultaneously controlled by wirings that are directly connected to the liquid crystal cells 54. In addition, the liquid crystal cells 54 may be sequentially controlled by using a thin film transistor array. In this case, the liquid crystal cells 54 may each include a single thin film transistor.

Since the optical device 400 includes the light amount controller 50, while a single beam is split into a plurality of beams, intensity of the beams may be controlled according to the controlling signals supplied from the driver 60. In this fashion, beams may be easily modulated if necessary, without needing a complicated structure, e.g., a general micro mirror array. Thus, the optical device 400 may be employed in many apparatuses.

Although the features of the inventive concept of FIGS. 7 through 9 are used alone, the features of the inventive concept of FIGS. 7 through 9 may be combined.

Figure 10:
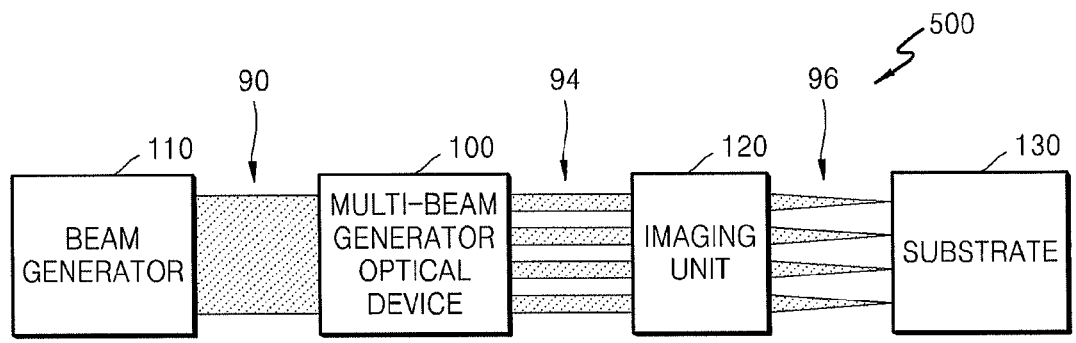
FIG. 10 illustrates a conceptual diagram of an exposure apparatus according to an embodiment of the inventive concept.

FIG. 10 is a conceptual diagram of an exposure apparatus 500 according to an embodiment of the inventive concept.

Referring to FIG. 10, the exposure apparatus 500 includes a beam generator 110, a multi-beam generating optical device 100, and an imaging unit 120. In FIG. 10, a substrate 130 is a subject to be exposed to the exposure apparatus 500. In addition, other subjects may be exposed. The substrate 130 may include a photosensitive material.

The beam generator 110 may generate the first parallel beam 90. The first parallel beam 90 may have a greater diameter than each third beam 94. To this end, the beam generator 110 may generate a plane beam having a greater diameter by diverging a laser beam with a concave lens and then converging the laser beam by a convex lens.

The first parallel beam 90 is transmitted through the multi-beam generating optical device 100 to be modified into the third beams 94. The multi-beam generating optical device 100 has been described with reference to FIG. 1, and thus its detailed description will not be repeated. However, the multi-beam generating optical device 100 may be replaced with the optical devices 200, 300, and 400 of FIGS. 7 through 9.

The imaging unit 120 may form an image on the substrate 130 by using the third beams 94, and thus the image may be formed on the photosensitive material of the substrate 130. The imaging unit 120 may include a digital micro-mirror device (not shown) including a plurality of micro-mirrors that may receive the third beams 94 and selectively reflect the third beams 94 according to external signals, and a projection lens (not shown) that controls a resolution of the third beams 94 that are reflected off the digital micro-mirror device, and then outputs the third beams 94 onto the photosensitive material of the substrate 130.

The third beams 94 are transmitted through the imaging unit 120 to be modified into fourth beams 96, and the fourth beams 96 may be incident on the photosensitive material of the substrate 130. Thus, the photosensitive material may be directly exposed to the fourth beams 96 without any photomask.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optical device, comprising:
   a first lens array including a plurality of first diffractive optical element (DOE) lenses two-dimensionally arranged on a first plane, the first lens array being configured to split a first parallel beam into a plurality of second beams by condensing the first parallel beam;
   a second lens array including a plurality of second DOE lenses arranged on a second plane parallel to the first plane so as to respectively correspond to the plurality of first DOE lenses, the second lens array being configured to modify the plurality of second beams into a plurality of third beams; and
   an adjustable spacer between the first and second lens arrays.

2. The optical device as claimed in claim 1, wherein an interval between the first plane and the second plane is equal to the sum of a focal length of each of the first DOE lenses and a focal length of each of the second DOE lenses, and
   wherein the plurality of third beams are parallel beams that are perpendicular to the second plane.

3. The optical device as claimed in claim 1, wherein a focal length of each of the first DOE lenses is greater than a focal length of each of the second DOE lenses.

4. The optical device as claimed in claim 1, wherein the adjustable spacer is a piezoelectric device.

5. The optical device as claimed in claim 4, further comprising a controller configured to control a voltage applied to the piezoelectric device to control an interval between the first lens array and the second lens array.

6. The optical device as claimed in claim 1, further comprising:
   a first transparent plate including the first lens array; and
   a second transparent plate including the second lens array,
   wherein the first lens array is formed on a first surface of the first transparent plate, and
   wherein an anti-reflective layer is formed on a second surface of the first transparent plate that is opposite to the first surface of the first transparent plate.

7. The optical device as claimed in claim 1, wherein the first DOE lenses have a single focal length,
   wherein at least some of the first DOE lenses have sizes different from the remaining first DOE lenses, wherein the second DOE lenses have a single focal length, and wherein at least some of the second DOE lenses corresponding to the at least some of the first DOE lenses have sizes different from the remaining second DOE lenses.

8. The optical device as claimed in claim 1, wherein each of the first DOE lenses or each of the second DOE lenses include a Fresnel zone plate.

9. The optical device as claimed in claim 1, wherein each of the first DOE lenses or each of the second DOE lenses includes a kinoform lens.

10. The optical device as claimed in claim 1, further comprising a filter having apertures that respectively correspond to centers of the first DOE lenses, wherein the filter is disposed on a focal plane of the first lens array.

11. The optical device as claimed in claim 1, wherein:
a number of the plurality of second and third beams equals a number of first DOE lenses.

12. The optical device as claimed in claim 1, wherein a ratio of intensity per unit area of the first parallel beam to intensity per unit area of the plurality of third beams is proportional to a square of a ratio of a focal length of each of the first DOE lenses to a focal length of each of the second DOE lenses.

13. The optical device as claimed in claim 1, wherein an interval between the first plane and the second plane is equal to a sum of a focal length of each of the first DOE lenses and a focal length of each of the second DOE lenses, wherein the sum is constant and at least one first DOE lens has a different focal length than other first DOE lenses and a corresponding second DOE lens has a different focal length than other DOE lenses.

14. An optical device, comprising:
a first lens array including a plurality of first diffractive optical element (DOE) lenses two-dimensionally arranged on a first plane, the first lens array being configured to split a first parallel beam into a plurality of second beams by condensing the first parallel beam;
a second lens array including a plurality of second DOE lenses arranged on a second plane parallel to the first plane so as to respectively correspond to the plurality of first DOE lenses, the second lens array being configured to modify the plurality of second beams into a plurality of third beams;
a liquid crystal panel including a plurality of liquid crystal cells that change a phase of a beam according to driving of liquid crystals therein; and
a rear polarization plate for controlling intensity of the beam according to the phase of the beam,
wherein the liquid crystal panel is on an optical path of the second beams or an optical path of the third beams so that the second beams or the third beams are transmitted through the liquid crystal cells.

15. The optical device as claimed in claim 14, further comprising a front polarization plate for polarizing a beam incident on the front polarization plate,
wherein the beam transmitted through the front polarization plate is transmitted through the liquid crystal panel so that a phase of the beam is changed.

16. The optical device as claimed in claim 14, wherein the liquid crystal cells are independently controlled so as to independently control intensities of the second beams.

17. An exposure apparatus, comprising:
a beam generator for generating a first parallel beam;
a first lens array including an array of first DOE lenses for splitting a first parallel beam into a plurality of second beams and condensing the plurality of second beams;
a second lens array including an array of second DOE lenses for modifying the plurality of second beams into a plurality of third beams;
an adjustable spacer between the first and second lens arrays; and
an imaging unit for forming an image on a photosensitive material using the plurality of third beams.

18. The exposure apparatus as claimed in claim 17, wherein the first lens array is spaced from the second lens array by a sum of a focal length of each of the first DOE lenses and a focal length of each of the second DOE lenses.

19. The exposure apparatus as claimed in claim 17, wherein the adjustable spacer includes a piezoelectric device between the first lens array and the second lens array,
wherein a divergence angle of the third beams is adjusted by controlling a voltage applied to the piezoelectric device to control an interval between the first lens array and the second lens array.

* * * * *